(12) United States Patent
Moidu

(10) Patent No.: US 7,715,076 B2
(45) Date of Patent: May 11, 2010

(54) MICROMIRROR DEVICE WITH A HYBRID ACTUATOR

(75) Inventor: AbdulJaleel K. Moidu, Nepean (CA)

(73) Assignee: JDS Uniphase Corporation, Milpitas, CA (US)

( * ) Notice: Subject to any disclaimer, the term of this patent is extended or adjusted under 35 U.S.C. 154(b) by 364 days.

(21) Appl. No.: 11/945,307

(22) Filed: Nov. 27, 2007

(65) Prior Publication Data

US 2008/0137165 A1 Jun. 12, 2008

Related U.S. Application Data

(60) Provisional application No. 60/867,841, filed on Nov. 30, 2006.

(51) Int. Cl.
*G02B 26/08* (2006.01)

(52) U.S. Cl. .............. 359/199.2; 359/198.1; 359/200.6; 359/224.1; 310/309

(58) Field of Classification Search .............. 359/199.2, 359/200.6
See application file for complete search history.

(56) References Cited

U.S. PATENT DOCUMENTS

| | | | |
|---|---|---|---|
| 6,612,029 B2 | 9/2003 | Behin et al. | |
| 6,822,776 B2 * | 11/2004 | Hah et al. ................. | 359/199.2 |
| 6,925,710 B1 | 8/2005 | Scalf et al. | |
| 6,934,439 B2 | 8/2005 | Miller et al. | |
| 6,968,101 B2 | 11/2005 | Miller et al. | |
| 7,010,188 B2 | 3/2006 | Miller et al. | |
| 7,079,299 B1 | 7/2006 | Conant et al. | |
| 7,095,546 B2 | 8/2006 | Mala et al. | |
| 7,167,290 B2 * | 1/2007 | Katoh et al. ............. | 359/200.6 |
| 7,167,613 B2 | 1/2007 | Miller et al. | |
| 2002/0127760 A1 | 9/2002 | Yeh et al. | |
| 2002/0146200 A1 | 10/2002 | Kudrle et al. | |
| 2006/0008201 A1 | 1/2006 | Miller et al. | |

OTHER PUBLICATIONS

Patterson et al, "A Scanning Micromirror with Angular Comb Drive Actuation", Proceedings of the IEEE 15th Annual International Conf. on Microelectro Mechanical Systems, MEMS 2002, Las Vegas, NV, Jan. 20-24, 2002; IEEE International Micro Electro Mechanical Systems Conf. New York, NY: IEEE, US, Vol. Conf. 15, 2002, pp. 544-547 XP010577713.

U.S. Appl. No. 11/733,821, filed Apr. 11, 2007, Moffat et al.

* cited by examiner

*Primary Examiner*—James Phan
(74) *Attorney, Agent, or Firm*—Teitelbaum & MacLean; Neil Teitelbaum; Doug MacLean

(57) ABSTRACT

A hybrid electro-static actuator for rotating a two-dimensional micro-electro-mechanical micro-mirror device about two perpendicular axes includes a vertical comb drive for rotating the micro-mirror about a tilt axis, and a parallel plate drive for rotating the micro-mirror about a roll axis. The rotor comb fingers of the comb drive extend from a sub-frame of the micro-mirror, which is only rotatable about the tilt axis, while one of the parallel plate electrodes is mounted on the underside of a main platform, which generally surrounds the sub-frame. The vertical comb drive rotates both the sub-frame and the main platform about the tilt axis, while the parallel plate drive only rotates the main platform about the roll axis.

18 Claims, 19 Drawing Sheets

Detailed views of the mirror structure and substrate

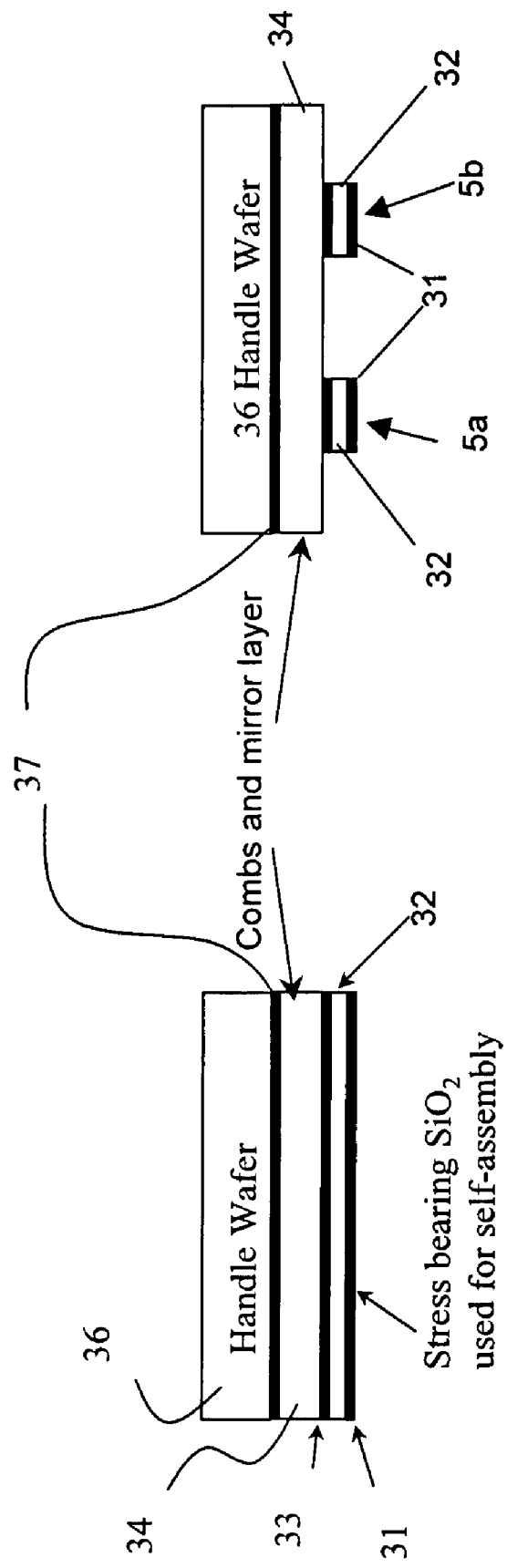

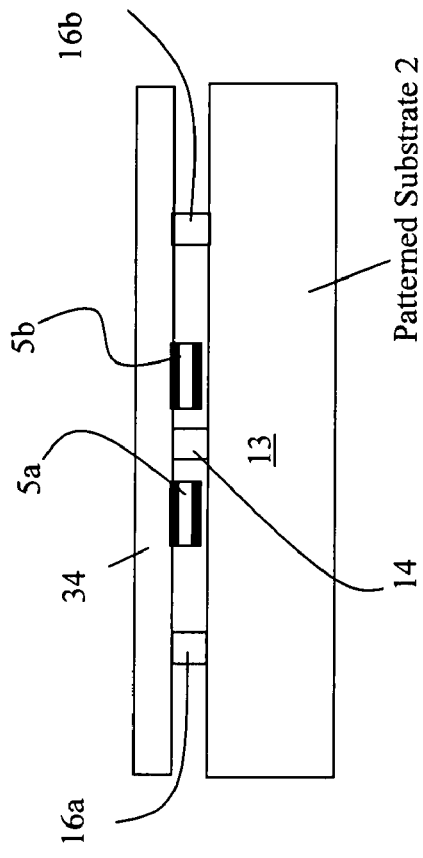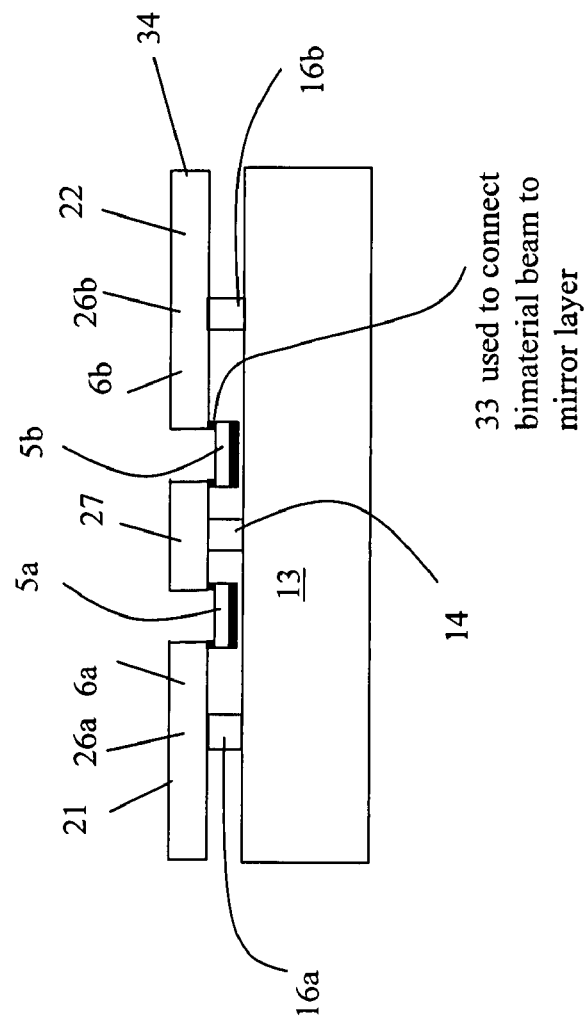

Remove handle and Bonding (course alignment)

Time etch for Bonding (course alignment)silicon thinning (beam section)

MICROMIRROR DEVICE WITH A HYBRID ACTUATOR

CROSS-REFERENCE TO RELATED APPLICATIONS

The present invention claims priority from U.S. Patent Application No. 60/867,841 filed Nov. 30, 2006, which is incorporated herein by reference.

TECHNICAL FIELD

The present invention relates to an array of optical micromirrors that are rotatable about two perpendicular axes, using a hybrid rotating actuator mechanism including an angular vertical comb drive for one axis, and a conventional parallel plate electro-static electrode for the other axis

BACKGROUND OF THE INVENTION

Major challenges in electro-statically actuated optical micro-electro-mechanical (MEMS) devices is to achieve a relatively high angle of rotation and to lower the actuation voltage, especially in the switching axis, i.e. the "piano" or Y axis. Conventional biaxial MEMS devices, such as those disclosed in U.S. Pat. Nos. 6,934,439 issued Aug. 23, 2005 in the name of Miller et al, and U.S. Pat. No. 7,095,546 issued Aug. 22, 2006 in the name of Mala et al include two sets of parallel plate electro-static electrodes for both tilt (Y-axis) and roll (X-axis) movements requiring complicated electrode and supply configurations, such as the ones disclosed in U.S. Pat. Nos. 6,968,101 issued Nov. 22, 2005, and U.S. Pat. No. 7,010,188 issued Mar. 7, 2006 both in the name of Miller et al. providing limited tilt angle (Y axis) range and control.

Parallel plates (PP) electro-static electrodes suffer from pull-in instability, which limits useable angular range; accordingly, parallel plate electrodes for both piano tilt and roll does not provide sufficient range for next generation devices.

A vertical comb drive is a type of MEMS actuator capable of relatively high actuator power using electrostatic principals of operation, and can be fabricated using standard materials and scalable processes developed in the semiconductor industry. Vertical comb drives can be advantageously used to control high-speed, high-resolution micro-mirrors in a variety of optical applications including optical scanning, optical switching, free-space optical communications, optical phased arrays, optical filters, external cavity lasers, adaptive optics and other applications.

The actuation principle of a typical vertical comb drive is electrostatic, wherein a potential difference is applied between two comb structures, a movable comb (or a rotor), and a stationary comb (or a stator). When a voltage is applied between them, a torque is developed from the electrostatic filed causing the movable comb to rotate about supporting hinges toward the stationary comb until the electrostatic torque is balanced by the restoring mechanical torque of the hinge springs. Different types of vertical comb drive devices are described in further detail, for example, in U.S. Pat. No. 6,612,029 issued to Behin et al, which is incorporated herein by reference.

Conventional vertical comb drives are relatively efficient compared to parallel plate electro-static electrode actuators, and may be designed to avoid the pull-in phenomenon in the actuation direction associated with parallel plate electrodes. However, a major challenge with vertical comb drives is the sub-micron comb finger alignment accuracy that is required for the stability of the actuator.

One type of comb actuator is a staggered vertical comb (SVC) drive in which the rotor and stator combs are fabricated in different layers. A typical prior art process flow involves creating the moving comb assembly by etching one silicon-on-insulator (SOI) wafer, and creating the stationary comb assembly by etching another SOI wafer, and then assembling the two etched wafers together to form the vertical comb drive. Different versions of such process are described in U.S. Pat. Nos. 6,925,710 and 7,079,299. However, stringent alignment requirements between the two wafers from which the two comb assemblies are formed can considerably complicate the device processing and negatively affect the device yield. A self-aligned mask process has been developed to overcome this issue disclosed in U.S. patent application Ser. No. 11/733,821 filed Apr. 11, 2007 in the name of Moffat et al, which is incorporated herein by reference, although such a self-aligned SVC process is relatively complex.

Another type of comb actuator is an angular vertical comb (AVC), in which both rotor and stator combs are fabricated in the same layer, and the rotor combs are pre-tilted or biased with respect to the stator combs later, preferably during the device release process. The major advantage of AVC is that the combs are automatically self-aligned as they are fabricated in the same device layer.

Unfortunately, in a two-dimensional gymbol arrangement, mirror tilt about the Y-axis affects the X-electrode geometry; therefore, if vertical comb drives were provided for both the X and Y tilting, the narrow finger spacing (as would be the case say in a self-aligned comb process), in the Y-axis tilt would lead to X stator/rotor interference that may cause lateral snap.

An object of the present invention is to provide a micromirror pivotable about two orthogonal axes (X and Y) with an actuator array structure using combs in the switching axis (Y) to obtain a relatively large tilt angle and/or to reduce the required voltage, while rotation about the X axis is achieved by a relatively easily manufactured parallel plate electro-static actuator, wherein the combs are decoupled from mirror roll as they are arranged internal to the X-axis hinge.

SUMMARY OF THE INVENTION

Accordingly, the present invention relates to a MEMs micro-mirror device comprising:

a substrate;

a mirrored platform pivotally mounted above the substrate for rotation about a longitudinal first axis and a lateral second axes;

a first hinge enabling the mirrored platform to rotate about the first axis;

a second hinge enabling the mirrored platform to rotate about the second axis;

a first electro-static plate electrode mounted on the substrate on one side of the first axis;

a second electro-static plate electrode mounted on an underside of the mirrored platform above the first electro-static plate electrode for attracting the first electro-static plate electrode and rotating the mirrored platform about the first axis;

a stator comb actuator extending longitudinally to the mirrored platform from the substrate; and a rotor comb actuator, for interleaving with the stator comb actuator, extending from the mirrored platform for rotating the mirrored platform about the second axis.

BRIEF DESCRIPTION OF THE DRAWINGS

The invention will be described in greater detail with reference to the accompanying drawings which represent preferred embodiments thereof, wherein:

FIG. 1b is an isometric view of the internal platform and the external deck of the micro-mirror structures of FIG. 1a;

FIG. 1c is an isometric view of the substrate of the micro-mirror structures of FIG. 1a;

FIG. 3 is a top view of the internal platform of the micro-mirror structures of FIG. 1a;

FIG. 7b is an top view of the internal platform and the external deck of the micro-mirror structures of FIG. 7a;

FIG. 8a to 8d illustrate a first method of manufacture in accordance with the present invention;

DETAILED DESCRIPTION

Figure 1A:
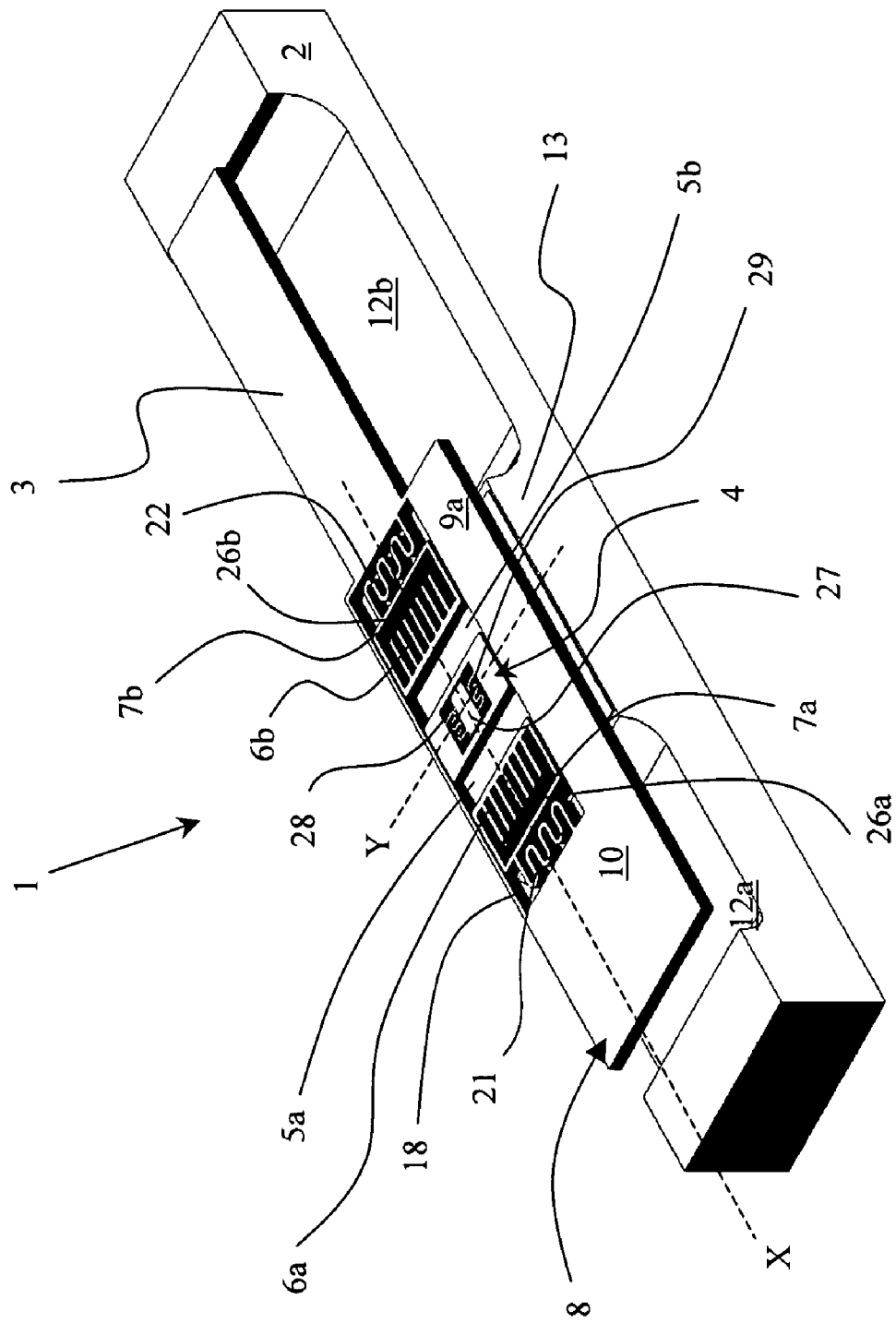
FIG. 1a is an isometric view of a micro-mirror structure in accordance with the present invention.
Figure 1B:
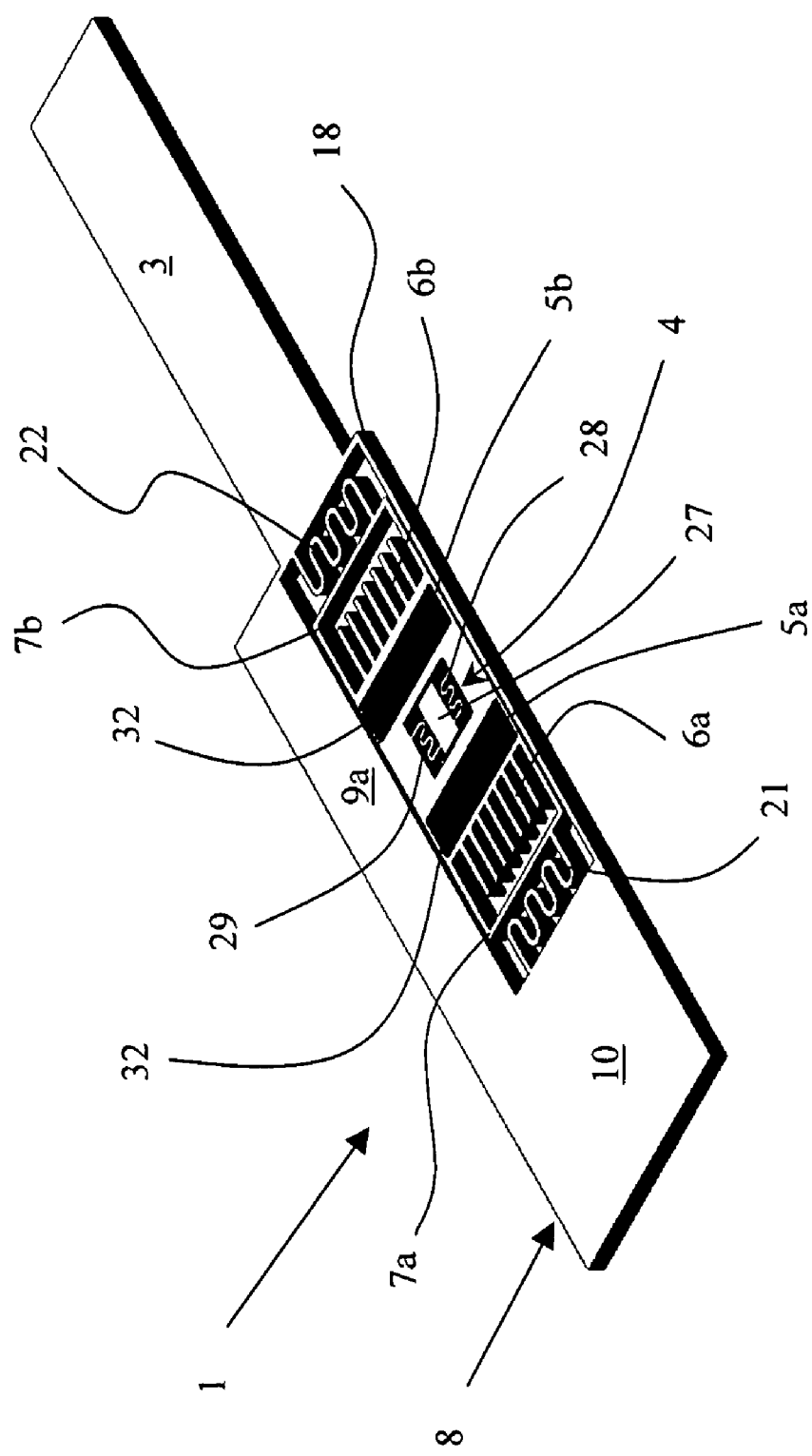
Figure 1C:
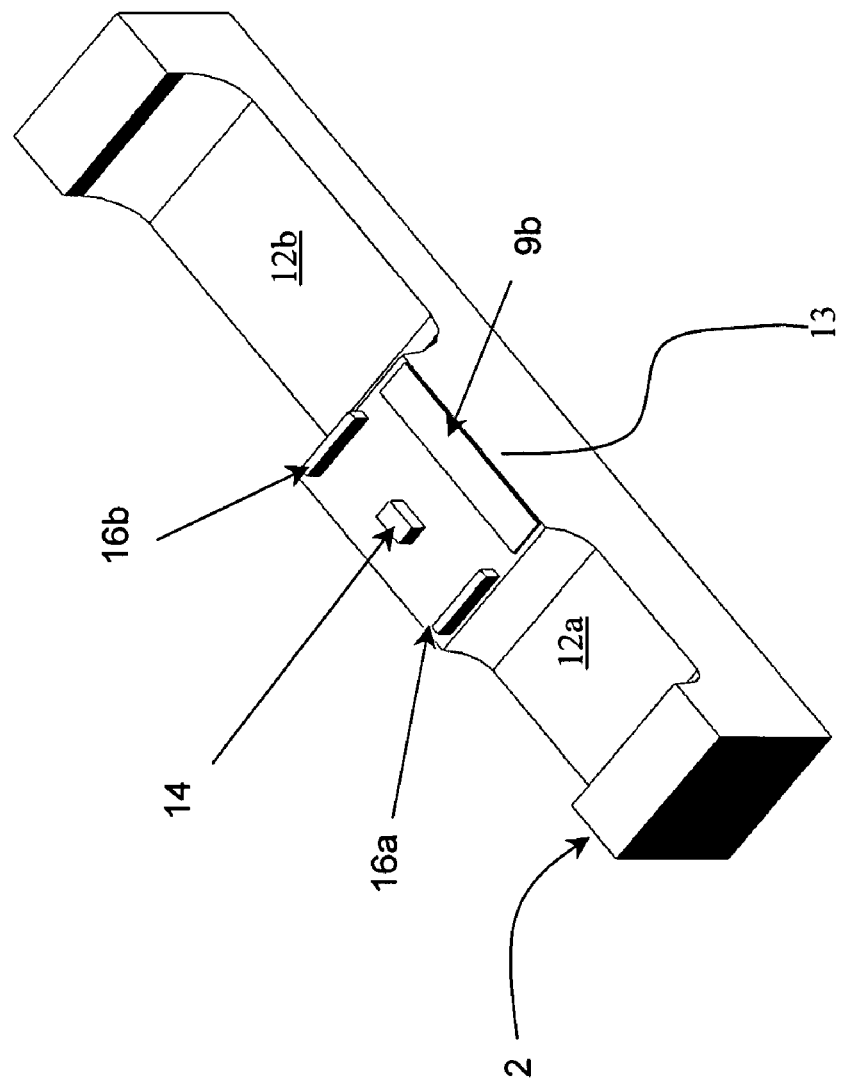

With reference to FIGS. 1a to 1c, the present invention relates to a micro-mirror structure 1, for simultaneously tilting a reflective surface 3 about a first lateral switching (Y or tilt) axis and a second orthogonal longitudinal rolling axis (X) above a substrate 2. The micro-mirror structure 1 utilizes a hybrid actuator, including a vertical comb drive (an AVC as illustrated or a SVC) for rotating the reflective surface 3 about the switching axis (Y) to obtain a relatively large tilt angle and to reduce the required voltage, and a parallel plate electro-static actuator for rotating the reflective surface 3 about the rolling axis (X).

An internal frame structure, e.g. platform 4, is pivotable about the Y-axis, and in the case of an AVC, includes bi-material cantilevered beams 5a and 5b on opposite ends thereof, with rotor combs 6a and 6b, respectively, extending therefrom parallel to the X axis. Rectangular skeletal frames 7a and 7b extend from the cantilevered beams 5a and 5b, respectively, surrounding and enclosing the rotor combs 6a and 6b, respectively. An external deck 8, pivotable about both the X and Y axes, surrounds the internal platform 4, and includes the reflective surface 3, a wing section 9a, a tail section 10, and a rectangular frame arm 18 extending between the reflective surface 3 and the tail section 10 on an opposite side of the external deck 8 to the wing section 9a. The mirrored section 3 is coated with a reflective coating, e.g. gold, for reflecting beams of light, while the tale section 10 providing an offsetting weight for balance.

The roll rotation about the X axis is achieved by a conventional parallel plate electro-static actuator including an X-electrode 9b mounted on the substrate 2 for attracting the underside of the wing section 9a of the external deck 8 acting as a matching electrode. The roll rotation doesn't affect the alignment of the comb drive due to fact that the internal platform 4 with the rotor combs 6a and 6b is arranged internal to the X-hinge (FIG. 3), and thereby only tilts about the Y axis.

With reference to FIG. 1c, the substrate 2, which may be glass or silicon, includes recesses 12a and 12b on either side of a raised pedestal portion 13 to provide a wide range of angular motion for the external deck 8 about the Y axis. The raised pedestal 13 includes the X-electrode 9b extending along one side thereof, a pedestal or anchor post 14 in the middle thereof at the intersection of the X and Y axes, from which the mirror structure 1 rotates, and a stator anchor 16a and 16b on each end thereof.

Figure 2:
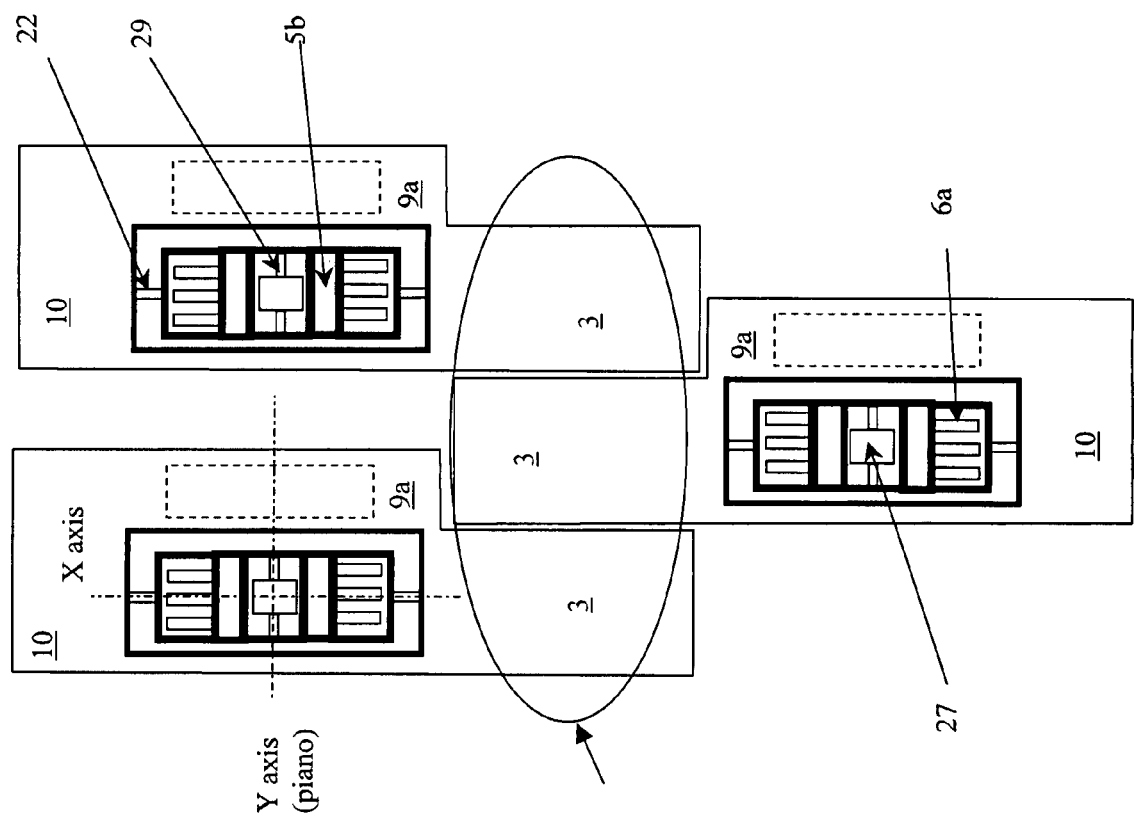
FIG. 2 is a top view of a plurality of the micro-mirror structures of FIG. 1a with their reflective surfaces interleaved.

The mirrored sections 3 can be interleaved with mirrored sections from adjacent mirror platforms, which extend in the opposite direction, as illustrated in FIG. 2, and as disclosed in U.S. Pat. No. 7,167,613 issued Jan. 23, 2007 to Miller el al, which is incorporated herein by reference.

Figure 3:
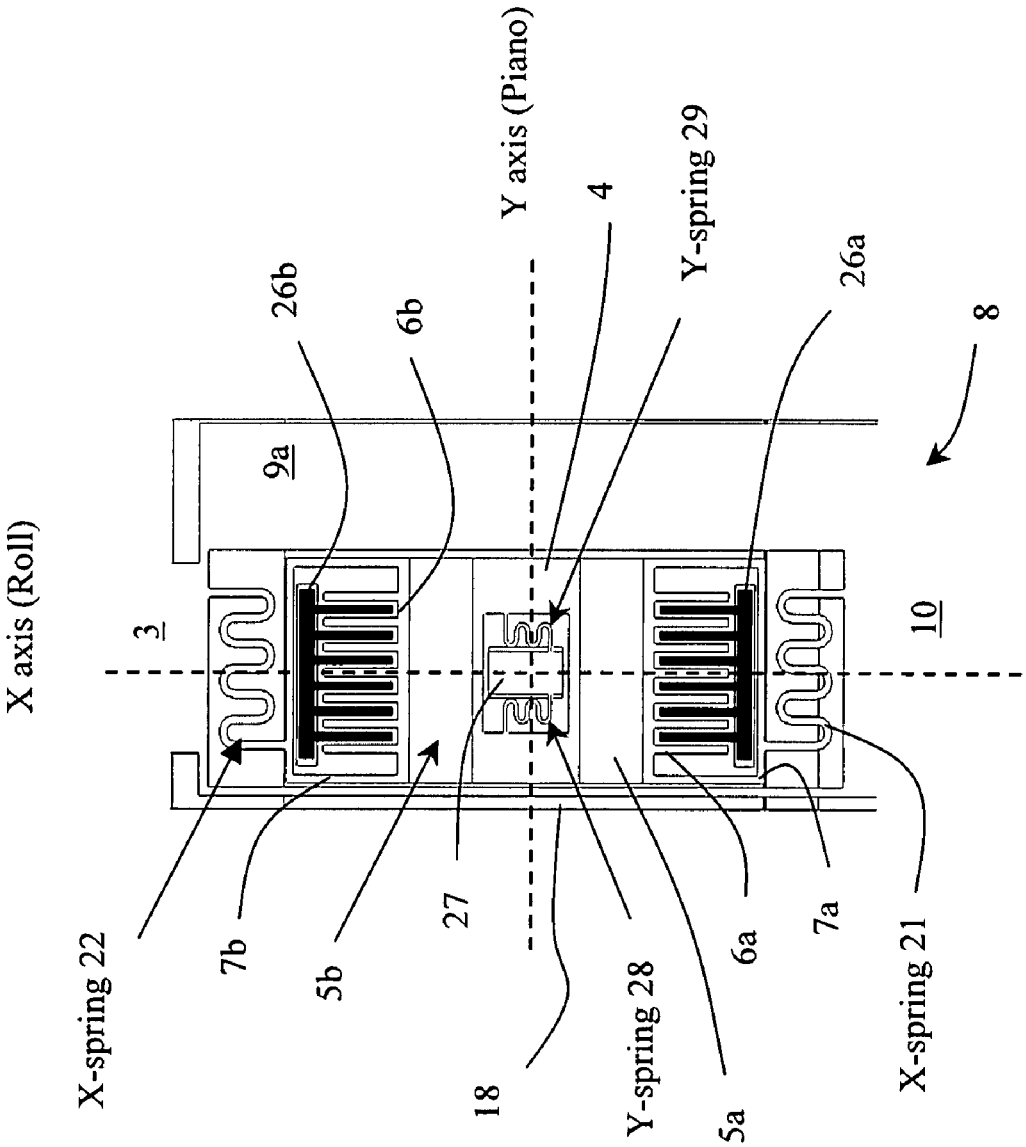

With particular reference to FIG. 3, the outer deck 8 and the internal platform 4 are pivotally interconnected by a first torsional hinge 21 extending between the tail section 10 and the rectangular frame 7a, and by a second torsional hinge 22 extending between the reflective surface 3 and the rectangular frame 7b, thereby defining the longitudinal X-axis. The first and second torsional hinges 21 and 22 can be serpentine beams having ends extending along the X-axis or having an end extending parallel to the X-axis on each side thereof, as illustrated in FIG. 3.

Figure 4:
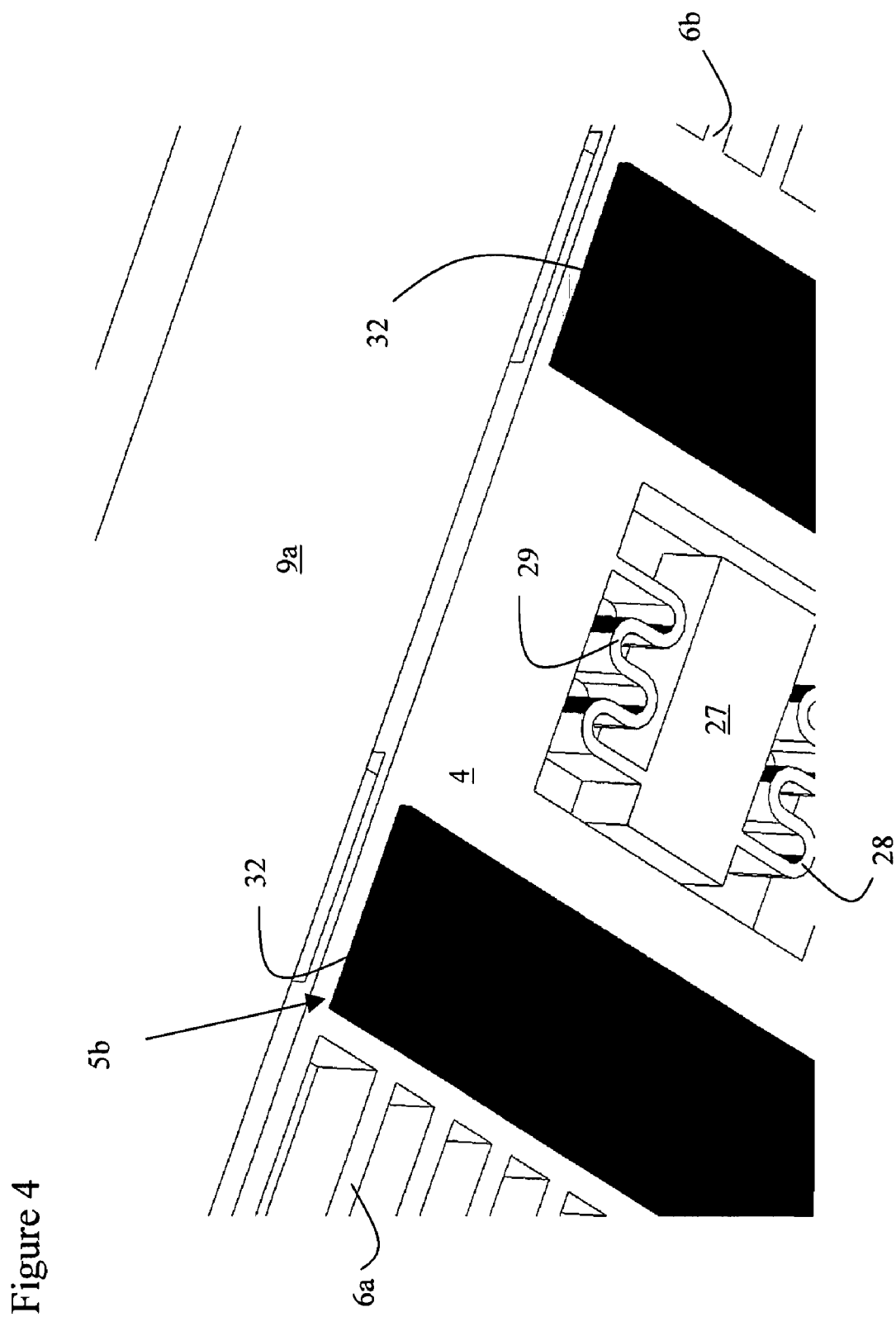
FIG. 4 is an isometric view of the internal platform of the micro-mirror structures of FIG. 1a from below.

Along with the rotor combs 6a and 6b, the comb drive includes two sets of longitudinally extending fixed (stator) combs 26a and 26b mounted on the stator anchors 16a and 16b having fingers interleaved with the fingers of the rotor combs 6a and 6b, respectively. A rectangular cap 27 is formed in the middle of the internal platform 4 for bonding to the top end of the anchor post 14. Third and fourth torsional hinges 28 and 29, best seen in FIGS. 3 and 4, extend from opposite sides of the rectangular cap 27 to the internal platform 4 for supporting the internal platform 4, thereby defining the lateral Y-axis. The third and fourth torsional hinges 28 and 29 can be serpentine beams having ends extending along the Y-axis or having an end extending parallel to the Y-axis on each side thereof, as illustrated in FIGS. 3 and 4.

The moving (rotor) combs 6a and 6b are in between the first and second torsional hinges 21 and 22, whereby the fingers of the moving combs 6a and 6b are free to rotate along with the outer deck 8 about the Y-axis (piano) via the third and fourth torsional hinges 28 and 29, but are independent of the outer deck 8 and remain stationary when the outer deck 8 rotates about the longitudinal X axis via first and second torsional hinges 21 and 22.

The Y-axis torsional hinges 28 and 29, are preferably serpentine torsion springs having a length smaller than a width of the mirror platform 3 or the tail sections 10, whereby the mirrored platforms 3 can be closely packed together with only a small air gap therebetween, and are fixed to the central post 14, which in turn is fixed to the substrate 2.

A key advantage of the angular vertical comb drive in this embodiment is that the comb fingers for both the rotor and stator combs 6a, 6b 26a and 26b can be processed in the same layer, providing self-alignment, and then the moving rotor combs 6a and 6b can be tilted at an acute angle to the substrate 2, providing an angular vertical comb drive, upon release during manufacture, by means of the pre-stressed bi-material, e.g. silicon-silicon dioxide, cantilevered beams 5a and 5b.

The rotor and stator fingers for the rotor and stator combs 6a, 6b, 26a and 26b need to be vertically offset from each other to produce the electrostatic force in the vertical direction as a voltage is applied. If the rotor and stator fingers are in same plane, there is no force in the vertical direction hence no torque for mirror tilt. According to the present invention, an angular vertical offset (pre-tilt) is easier to realize in one layer by curling the cantilevered beams 5a and 5b during release in order to pre-tilt the rotor combs 6a and 6b. With limited space available, it is practically impossible to make all of the comb fingers in one layer and then offset the rotor or stator combs 6a, 6b 26a and 26b linearly in the vertical direction.

Accordingly, with reference to FIGS. 8a to 9e, the cantilevered beam sections 5a and 5b have a bi-material structure including an main structural layer 31, which may or may not be contiguous with the internal platform 4, e.g. a thin silicon layer, and a pre-stressed layer 32, e.g. a thermally grown silicon dioxide layer underneath the upper structural layer 31. The pre-stressed layer 32 (FIG. 4) has residual compressive stress, typically about 300 Mpa. Silicon dioxide is preferred as it may be processed at very high temperature, e.g. 1000° C., hence is relatively defect free, ensuring the stability of the stress over time at operational temperature regime of the device, i.e. 0° C. to 70° C.

Alternatively, the pre-stressed layer 32 may comprise a compressive poly-silicon layer deposited underneath the structural layer 31, or a tensile poly-silicon layer 32 on top of the thin structural layer 31. Like thermal silicon oxide, poly-silicon is expected to be stable at operational temperatures.

Figure 5:
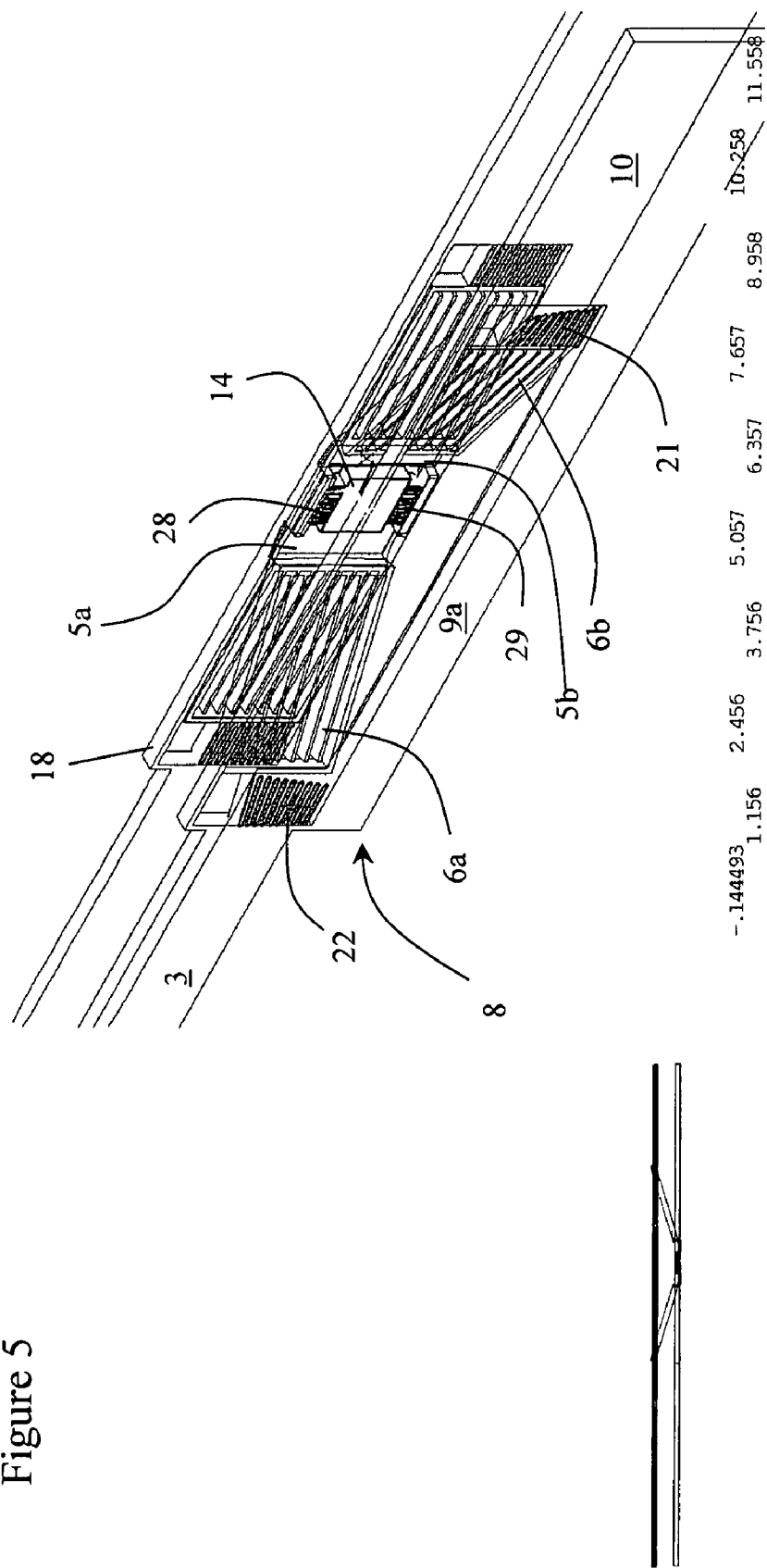
FIG. 5 is an isometric view of the internal platform and the external deck of the micro-mirror structures of FIG. 1a in accordance with a first angular vertical comb drive embodiment of the present invention.
Figure 6:
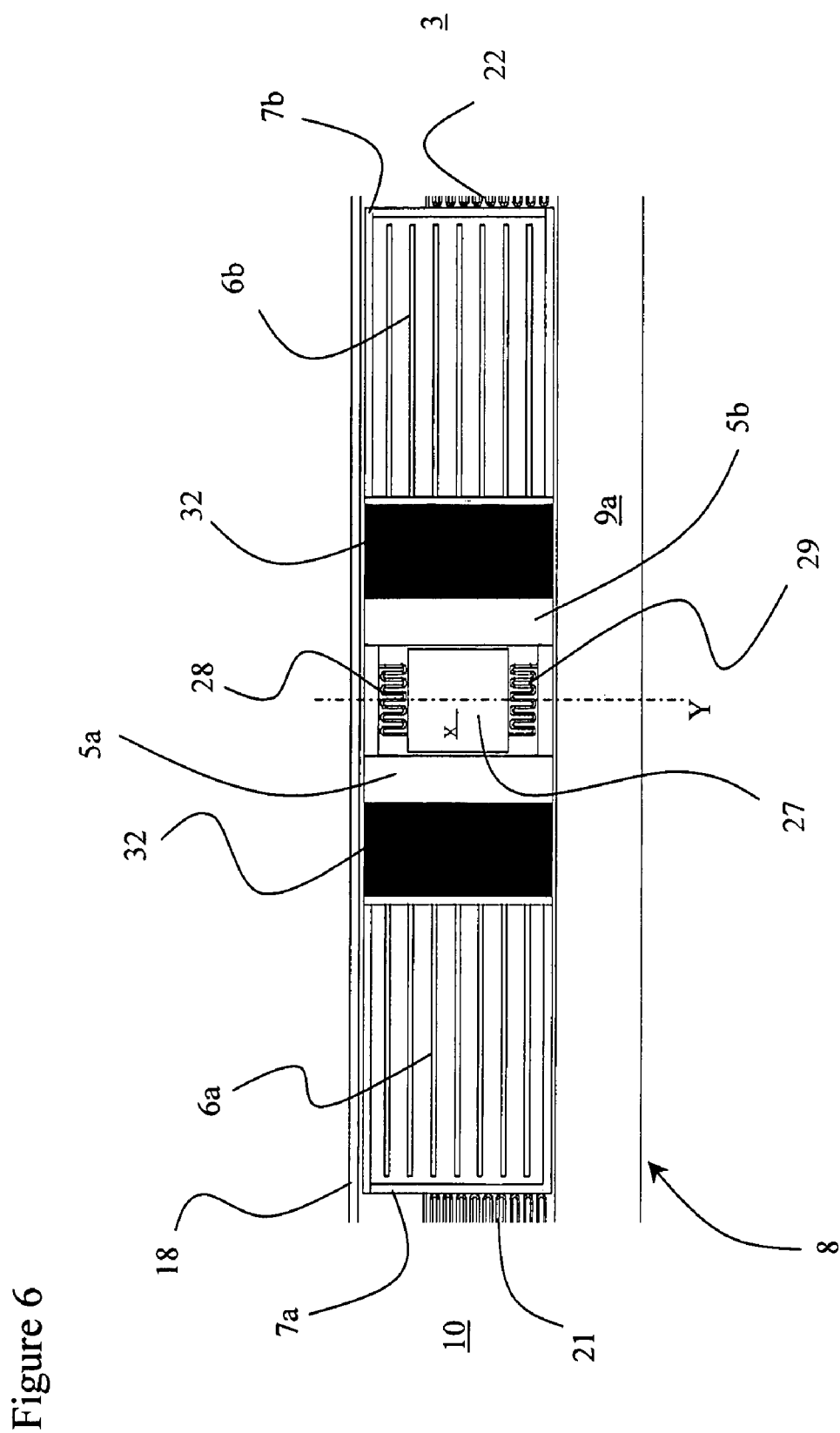
FIG. 6 is an top view of the internal platform and the external deck of the micro-mirror structures of FIG. 5.

Upon release, the stress in the pre-stressed layers 32 cause the cantilevered beams 5a and 5b to bend upwardly, and the rotor combs 6a and 6b to tilt at an acute angle to the substrate 2 and/or the external deck 8, as shown in FIG. 5. In the simulation given in FIG. 5, the cantilevered beams 5a and 5b are such that not only the rotor combs 6a and 6b are tilted, but also the external deck 8 is lifted up relative to the Y-hinge, i.e. the third and fourth torsional hinges 28 and 29, and the anchor post 14, as shown; which is an advantageous configuration, since it provides additional moving space for the external deck 8. As illustrated FIG. 6, the rectangular frames 7a and 7b are connected to the cantilevered beams 5a and 5b, respectively, whereby the outer ends of the fingers of the rotor combs 6a and 6b bend along with the rectangular frames 7a and 7b. The rectangular frames 7a and 7b are also connected to the external deck 8 via the first and second torsional hinges 21 and 22, whereby the entire external deck 8 lifts up with the ends of the rotor combs 6a and 6b.

Figure 7A:
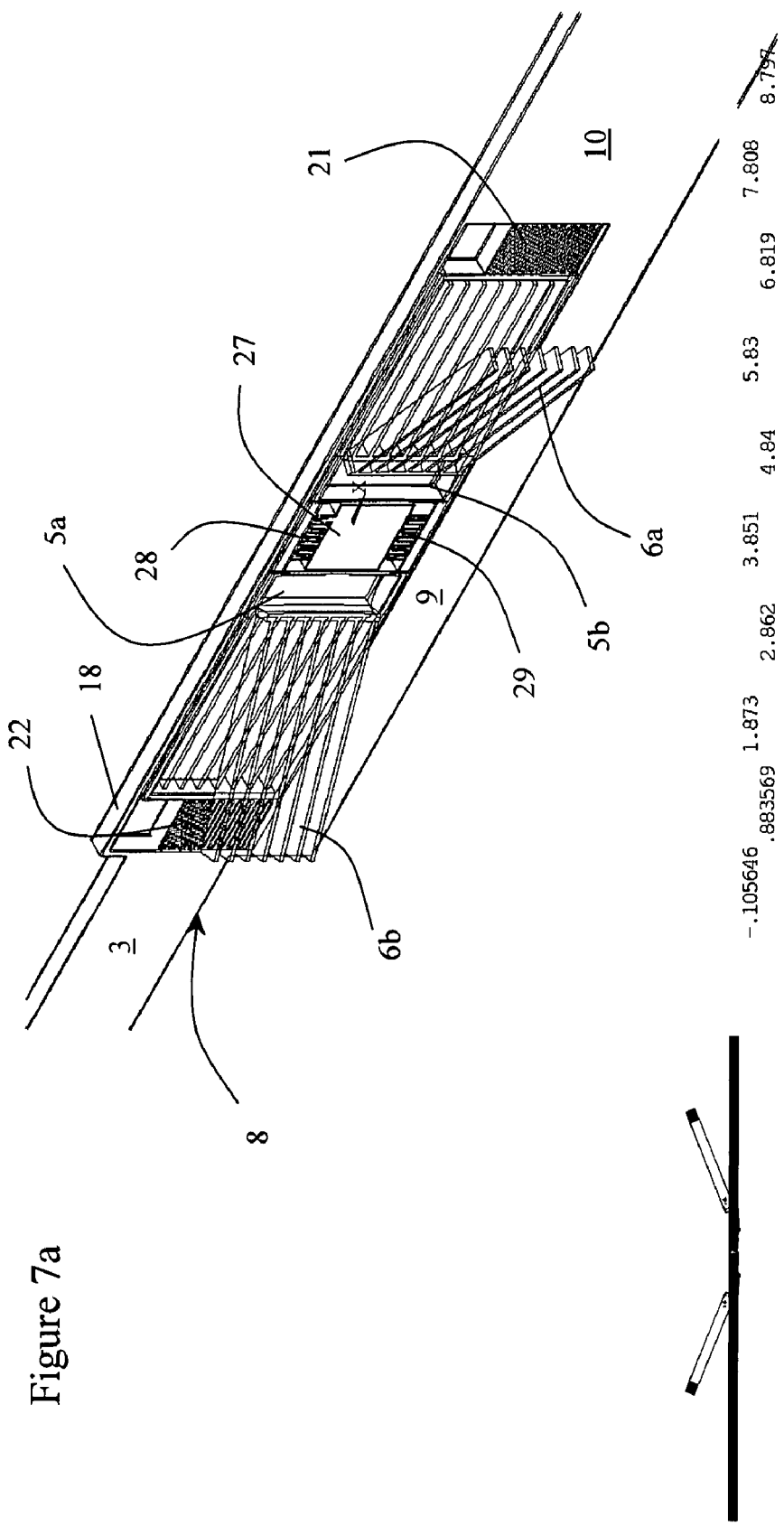
FIG. 7a is an isometric view of the internal platform and the external deck of the micro-mirror structures of FIG. 1a in accordance with a second angular vertical comb drive embodiment of the present invention.
Figure 7B:
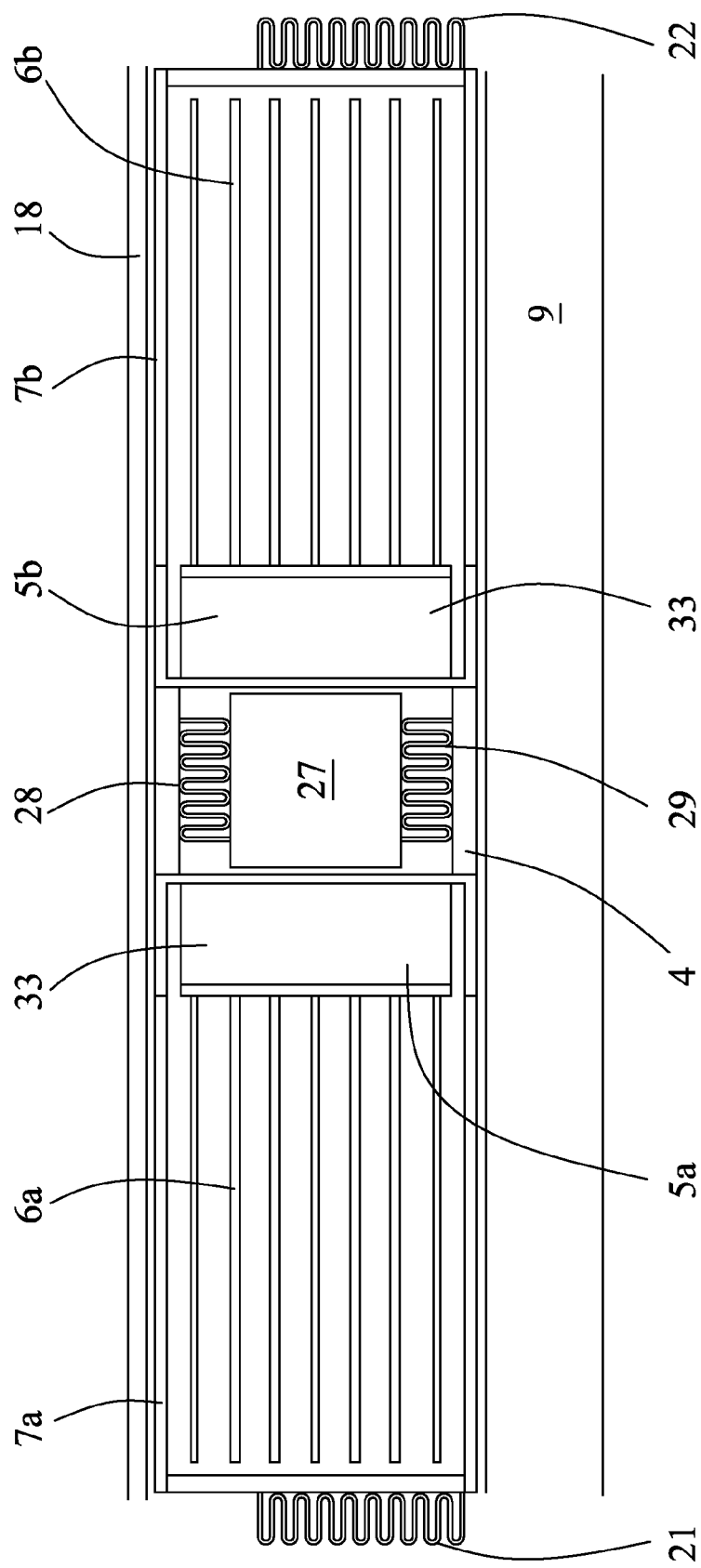

Alternatively, as shown in FIG. 7a, the cantilevered beams 5a and 5b may be designed such that only the rotor fingers 6a and 6b are tilted at an acute angle relative to the substrate 2 and/or the external deck 8, keeping the rest of the external deck 8 in the same plane as the internal platform 4, i.e. the square cab 27 and the torsional hinges 28 and 29. As illustrated in FIG. 7b, in the embodiment of FIG. 7a, the outer ends of the fingers in the rotor combs 6a and 6b are free and unrestrained, and therefore tilt by themselves with the cantilevered beams 5a and 5b, respectively. The rectangular frames 7a and 7b, surrounding the rotor combs 6a and 6b, respectively, extend from the internal platform 4 separate from the cantilevered beams 5a and 5b, and therefore do not bend along with the rotor fingers 6a and 6b and the cantilevered beams 5a and 5b.

When a potential difference is applied between the grounded rotor combs 6a and 6b on the internal platform 4 and the live stator combs 26a and 26b fixed to the substrate 2, a torque is produced by the electrostatic force in the vertical direction between the rotor and stator comb pairs 6a and 26a, 6b and 26b, and results in the tilting of the entire mirror device 1, i.e. the internal platform 4 and the external deck 8, about the third and fourth (Y-axis) hinges 28 and 29.

The external deck 8 rotates about the X-axis when a potential difference is applied between the wing section 9a, and the X-electrode 9b patterned on the substrate 2, due to the electrostatic force of attraction between the wing section 9a and the X-electrode 9b. When the external deck 8 tilts in the roll or X-direction, the rotor combs 6a and 6b are stationary since they are arranged internal to the first and second X-axis hinges 21 and 22.

The present invention may be realized by starting with a double silicon on insulator (DSOI) structure or a single SOI structure, as shown in FIGS. 8a to 8d and FIGS. 9a to 9e, respectively. In the DSOI case, FIG. 8a illustrates a multi-layer structure including the pre-stressed insulator layer 31, e.g. a first a thermal oxide layer of desired thickness (typically 2 um), grown on a first structural, e.g. silicon, layer 32, with a second insulator, e.g. silicon dioxide layer, 33 and a second structural layer 34 formed thereon. A handle wafer 36 with a release layer 37 is provided for supporting the multi-layer structure during manufacture. In FIG. 8b, the first structural layer 32 and pre-stressed layer 31 are patterned from the backside to form the cantilevered beams 5a and 5b. The DSOI structure is then bonded to the patterned substrate 2, (see FIG. 8c) which has already been formed to include the recesses 12a and 12b and the raised pedestal 13 with the anchor post 14 and the stator anchors 16a and 16b. The handle wafer 36 is then removed with the release layer 37. The next step is illustrated in FIG. 8d, in which the comb pairs 6a, 6b, 26a and 26b and the torsional hinges 21, 22, 28 and 29 are then processed in the exposed Si layer 34, releasing the cantilevered beams 5a and 5b, simultaneously, which results in the self-assembly of the rotor combs 6a and 6b, as described previously.

Figure 9B:
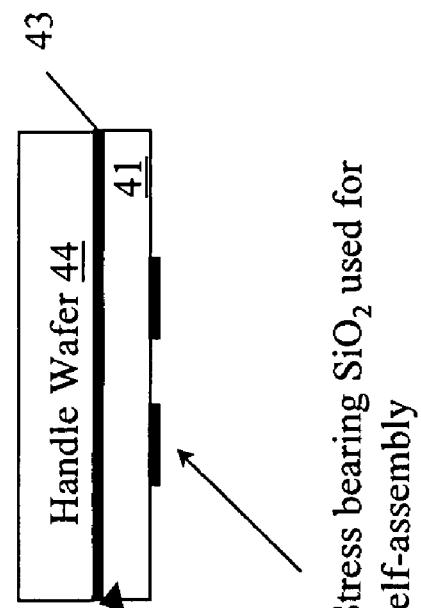
FIG. 9a to 9e illustrate a second method of manufacture in accordance with the present invention.
Figure 9A:
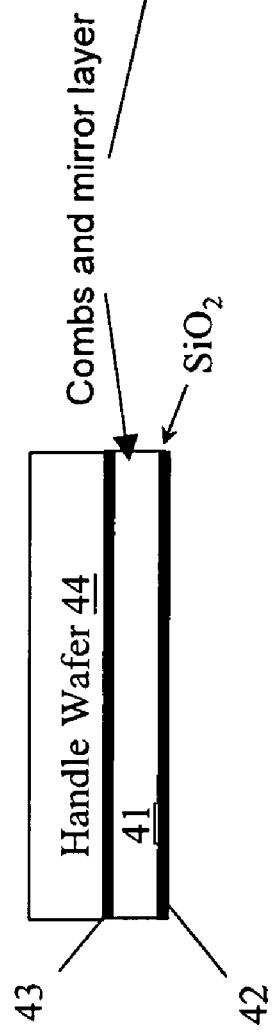
Figure 9C:
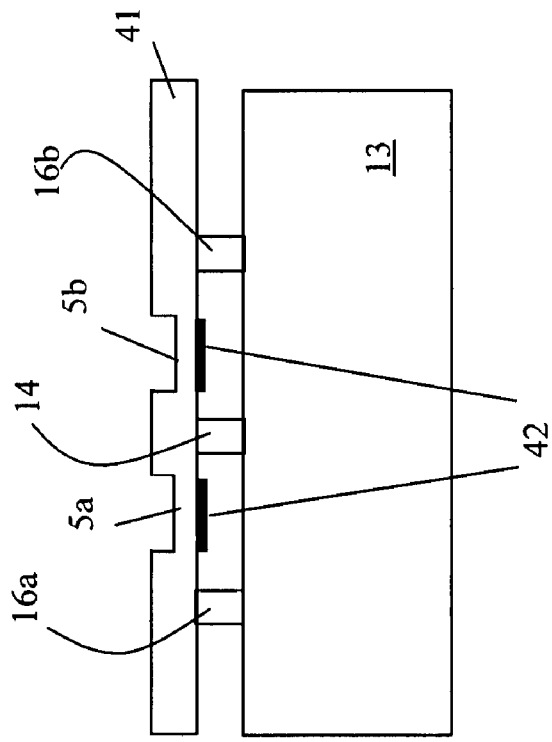
Figure 9D:
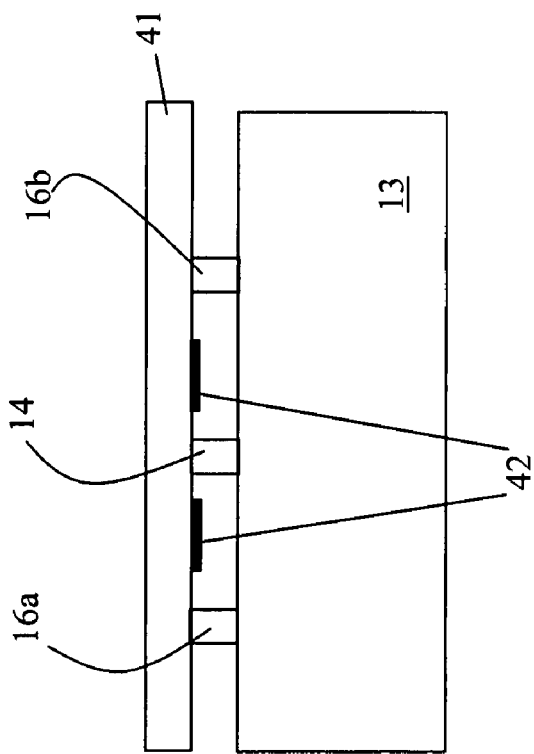
Figure 9E:
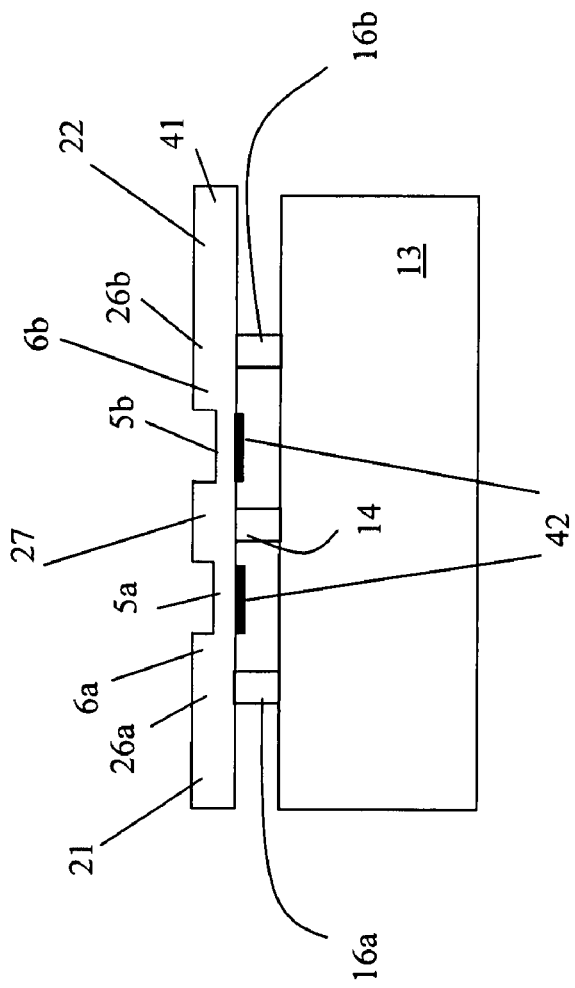
Figure 10:
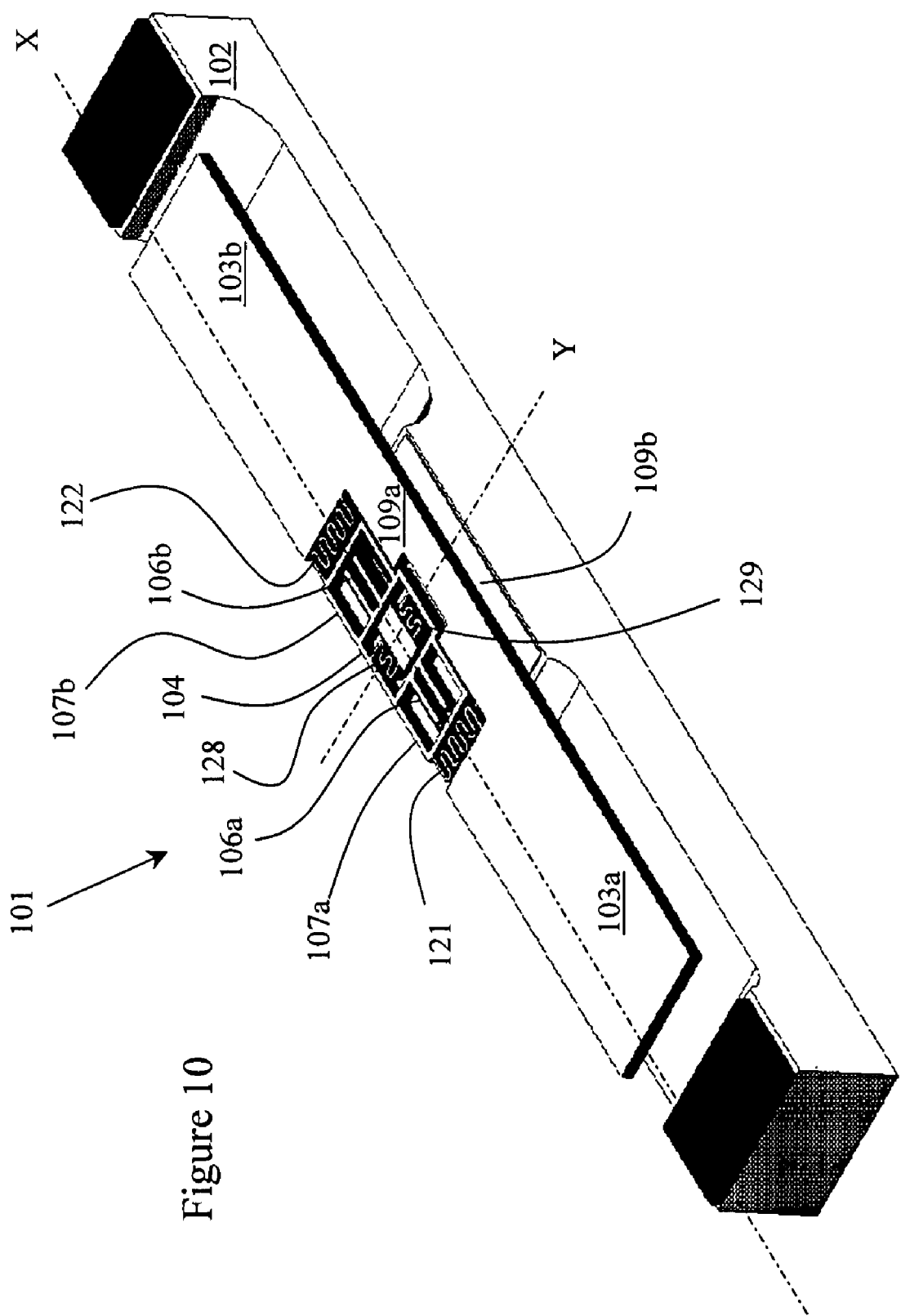
FIG. 10 is an isometric view of a micro-mirror structure in accordance with a staggered vertical comb drive embodiment of the present invention.

The design may also be realized simply by a single SOI, as shown in FIGS. 9a to 9e. FIG. 9a illustrates the first step, in which a single SOI structure is provided including a structural, e.g. silicon, layer 41 between a pre-stressed insulating, e.g. silicon dioxide, layer 42 and a release layer 43, all supported by a handle wafer 44. In the second step, illustrated in FIG. 9b, the pre-stressed layers 41 for the cantilevered beams 5a and 5b are grown, patterned on, and etched from the structural layer 41. The SOI structure is then bonded to the patterned substrate 2, (see FIG. 9c) which has already been formed to include the recesses 12a and 12b and the raised pedestal 13 with the anchor post 14 and the stator anchors 16a and 16b. Then a timed etch is performed on the exposed structural layer 41 to thin the material, e.g. silicon, at the section including the cantilevered beams 5a and 5b, see FIG. 9d. After the thinning step, the comb pairs 6a, 6b, 26a and 26b and the torsional hinges 21, 22, 28 and 29 are then processed in the exposed Si layer 41, releasing the cantilevered beams 5a and 5b simultaneously, which results in the self-assembly of the rotor combs 6a and 6b, as described previously.

A staggered vertical comb drive embodiment of the present invention is illustrated in FIGS. 10 to 13, in which a MEMS micro-mirror device 101 for simultaneously tilting reflective surfaces 103a an 103b about a first lateral switching (Y) axis and a second orthogonal longitudinal rolling axis (X) above a substrate 102. The micro-mirror structure 100 utilizes a hybrid actuator, including a staggered vertical comb drive for rotating the reflective surfaced 103a 103b about the switching axis (Y) to obtain a relatively large tilt angle and to reduce the required voltage, and a parallel plate electro-static actuator for rotating the reflective surfaces 103a and 103b about the rolling axis (X).

An internal rectangular or square skeletal frame structure 104 is pivotable about the Y-axis, with rotor combs 106a and 106b, respectively, extending therefrom parallel to the X axis. The rectangular frame 104 includes rectangular skeletal arms 107a and 107b extending from opposite ends sides thereof, surrounding and enclosing the rotor combs 106a and 106b, respectively. An external deck 108, pivotable about both the X and Y axes, substantially surrounds the internal frame structure 104 (at least three sides thereof), and includes the reflective surfaces 103a and 103b, and a wing section 109a. The mirrored sections 103a and 103b are coated with a reflective coating, e.g. gold, for reflecting beams of light.

The roll rotation about the X axis is achieved by a parallel plate electro-static actuator including an X-electrode 109b mounted on the substrate 102 for attracting the underside of the wing section 109a of the external deck 108 acting as a matching electrode. The roll rotation doesn't affect the alignment of the comb drive due to fact that the internal frame structure 104 with the rotor combs 106a and 106b is arranged internal to the X-hinge (FIG. 12), i.e. in between torsional hinges 121 and 122, and thereby only tilts about the Y axis.

Figure 11:
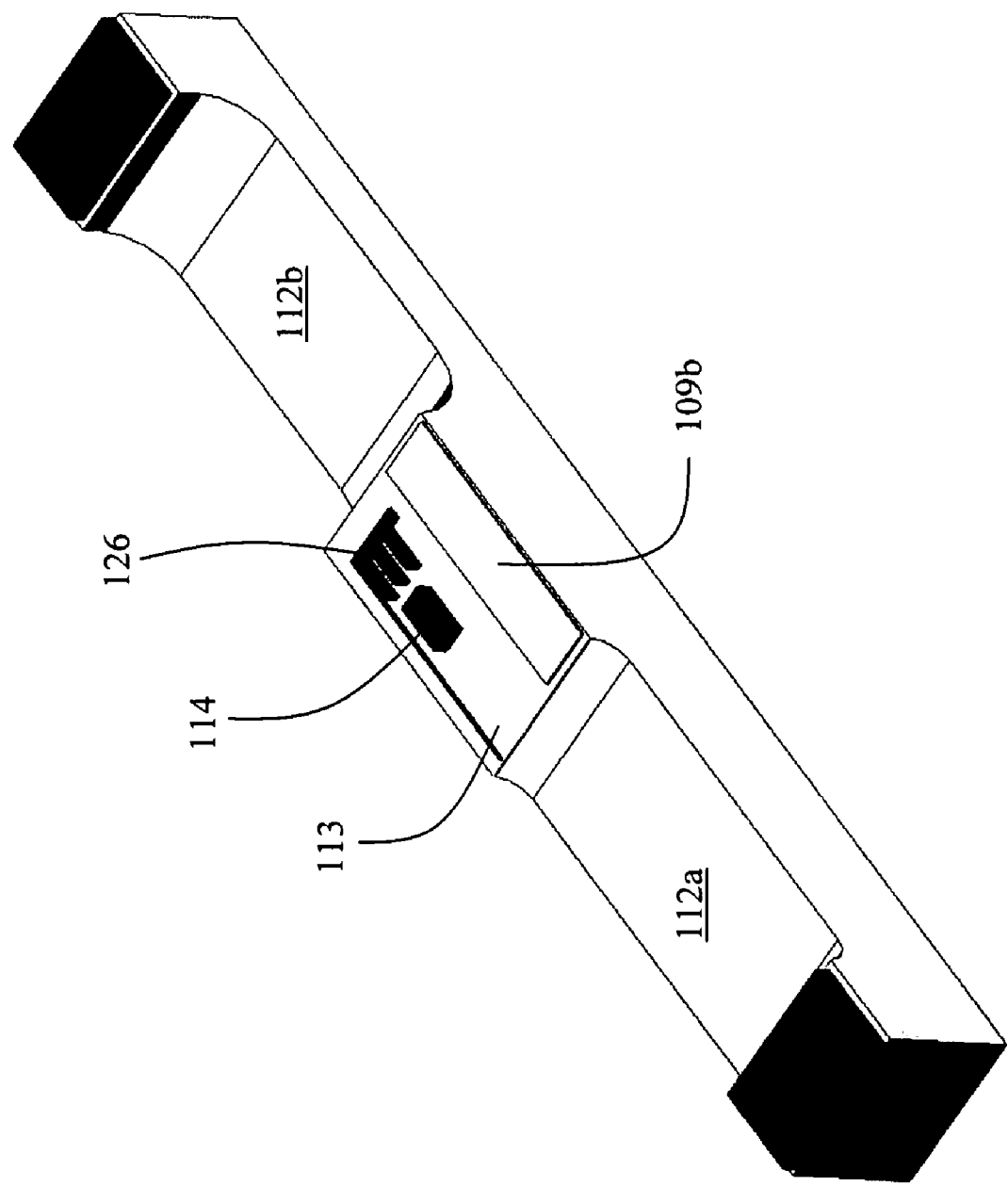
FIG. 11 is an isometric view of the substrate of the micro-mirror structure of FIG. 10.

With reference to FIG. 11, the substrate 102, which may be glass or silicon, includes recesses 112a and 112b on either side of a raised pedestal portion 113 to provide a wide range of angular motion for the external deck 108 about the Y axis. The raised pedestal 113 includes the X-electrode 109b extending along one side thereof, a pedestal or anchor post 114 in the middle thereof, from which the mirror structure 101 rotates, and at least one set of stator combs 126. A second set of stator combs can be provided if necessary.

Figure 12:
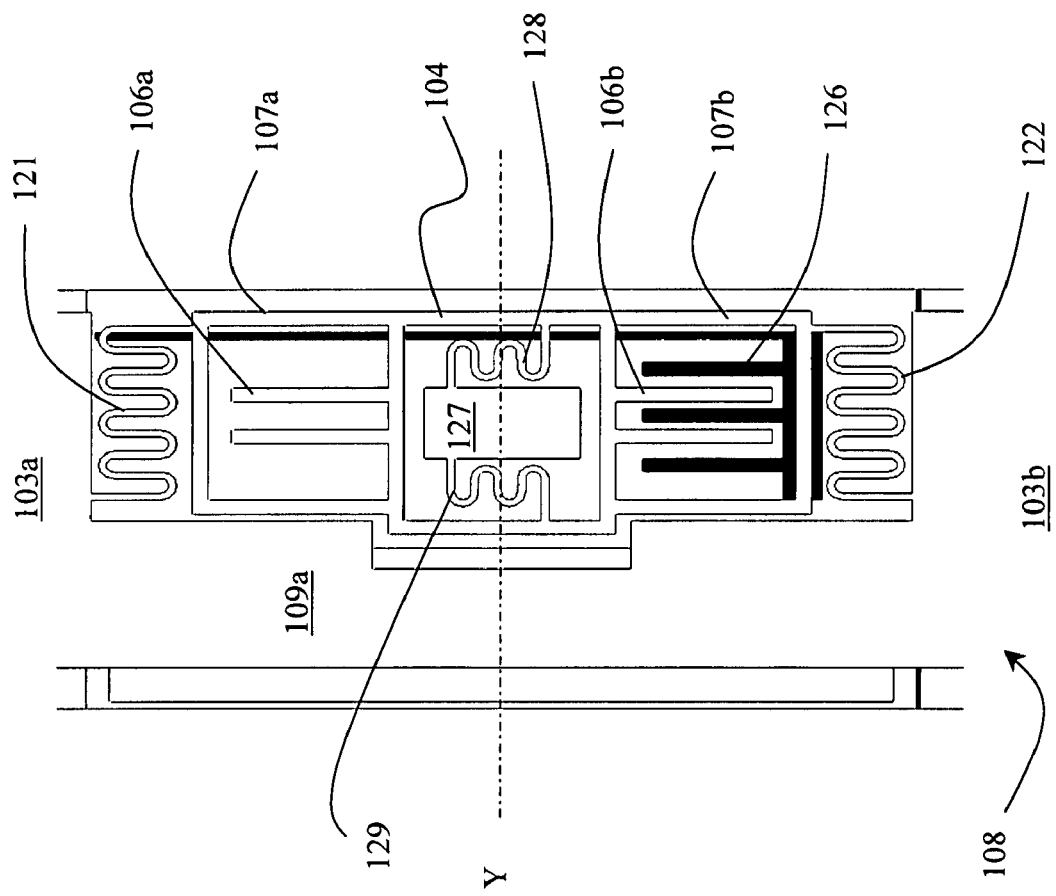
FIG. 12 is a top view of the internal platform of the micro-mirror structure of FIG. 10.
Figure 13:
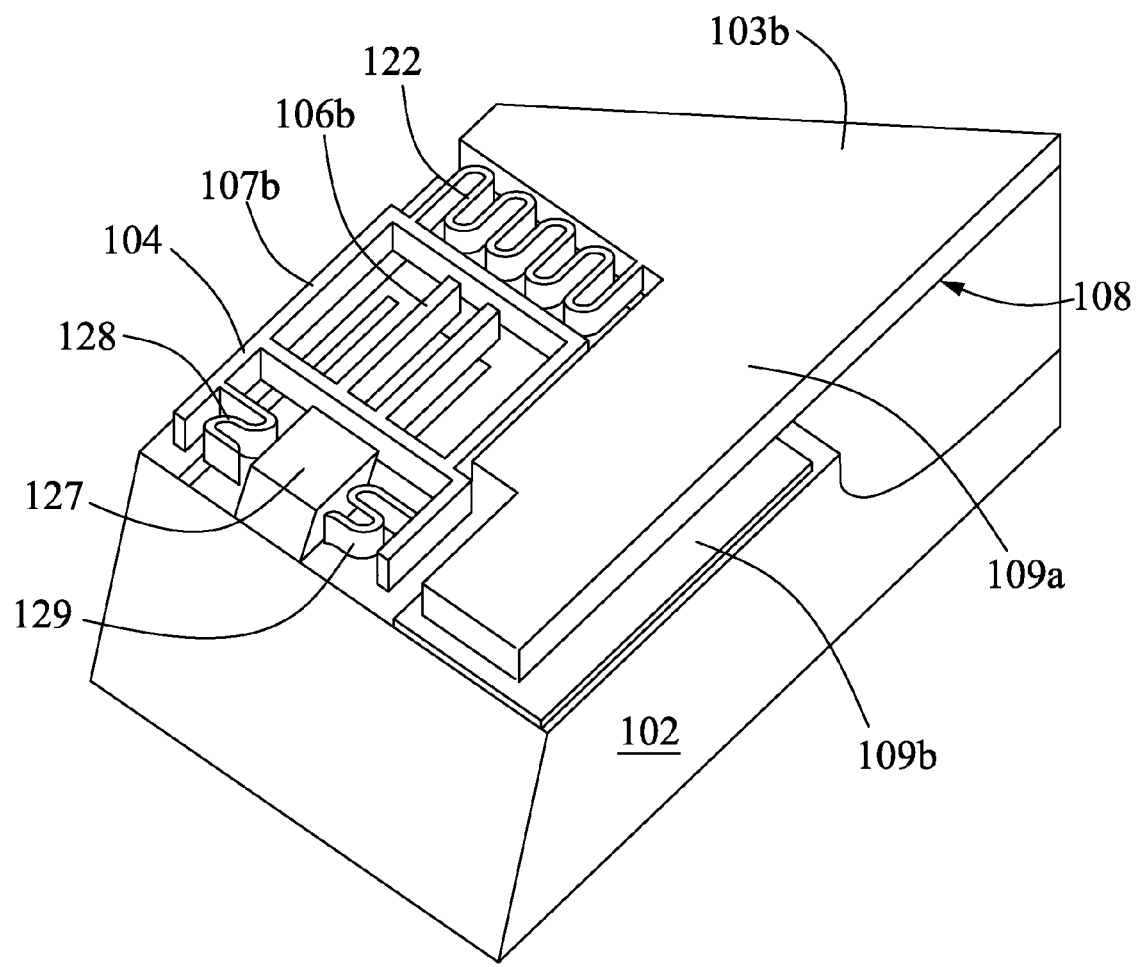
FIG. 13 is an isometric view of the internal platform of the micro-mirror structure of FIG. 10.

With particular reference to FIG. 12, the outer deck 108 and the internal frame structure 104 are pivotally interconnected by a first torsional hinge 121 extending between the first mirrored section 103a and the rectangular frame 107a, and by a second torsional hinge 122 extending between the second reflective surface 103b and the rectangular frame 107b, thereby defining the longitudinal X-axis. The first and second torsional hinges 121 and 122 can be serpentine beams having ends extending along the X-axis or having an end extending parallel to the X-axis on each side thereof, as illustrated.

Along with the rotor combs 106a and 106b, the comb drive includes at least one set of longitudinally extending fixed (stator) combs 126 mounted on the substrate 102 having fingers interleaved with the fingers of the rotor combs 106a and/or 106b. The fixed combs 126 extend parallel to the rotor combs 106a and 106b, respectively, but in a parallel plane, i.e. the rotor combs 106a and 106b extend in a first plane including the outer deck 108, which is superposed above a second plane including the fixed combs 126 extending therein. A rectangular cap 127 is formed in the middle of the internal frame structure 104 for bonding to the top end of the anchor post 114. Third and fourth torsional hinges 128 and 129, best seen in FIG. 12, extend from opposite sides of the rectangular cap 127 to the sides of the internal frame structure 104 for supporting the internal frame structure 104, the rotor combs 106a and 106b, and the rectangular frames 107a and 107b, thereby defining the lateral Y-axis. The third and fourth torsional hinges 128 and 129 can be straight springs or serpentine beams having ends extending along the Y-axis or having an end extending parallel to the Y-axis on each side thereof, as illustrated.

When a potential difference is applied between the grounded rotor combs 106b on the mirror 101, and live stator combs 126 fixed to the substrate 102, a torque is produced by the electrostatic force in the vertical direction between the rotor and stator comb pairs causing the rotor combs 106b to rotate at an acute angle to the stator comb 126, and results in the tilting of the entire mirror structure 101 about the Y-axis torsional hinges 128 and 129. The Y-axis torsional hinges 128 and 129, are preferably positioned between the first and second reflective surfaces 103a and 103b, and comprise serpentine torsion springs having a length smaller than a width of the mirror platform 103a, whereby reflective surfaces 103a and 103b or adjacent mirrors can be closely packed together with only a small air gap therebetween. The inner ends of the torsional hinges 128 and 129 are fixed to the cap 127, which is mounted on the central post 114, which in turn extends from the substrate 102.

The moving (rotor) comb fingers 106a and 106b are in between the first and second torsional hinges 121 and 122, whereby the moving comb fingers 106a and 106b are free to rotate along with the outer deck 108 about the Y-axis (piano) via the third and fourth torsional hinges 128 and 129, but are independent of the outer deck 108 and remain stationary when the outer deck 108 rotates about the longitudinal X axis via first and second torsional hinges 121 and 122.

The design of the embodiment of FIGS. 10 to 14 is realized by a double SOI on a substrate process, and involves only one bonding step. One of the layers of the double SOI will form the stator fingers 126 fixed to the substrate 102, and the second layer will form the mirrors 103a and 103b/rotor fingers 106a and 106b/hinge structures 121, 122, 128 and 129. The fabrication of the staggered comb drive is disclosed in U.S. patent application Ser. No. 11/733,821 filed Apr. 11, 2007 in the name of Moffat et al, which is incorporated herein by reference.

I claim:

1. A MEMs micro-mirror device comprising:
   a substrate;
   a mirrored platform pivotally mounted above the substrate for rotation about a longitudinal first axis and a lateral second axes;
   a first hinge enabling the mirrored platform to rotate about the first axis;
   a second hinge enabling the mirrored platform to rotate about the second axis;
   a first electro-static plate electrode mounted on the substrate on one side of the first axis;
   a second electro-static plate electrode mounted on an underside of the mirrored platform above the first electro-static plate electrode for attracting the first electro-static plate electrode and rotating the mirrored platform about the first axis;
   a stator comb actuator extending longitudinally to the mirrored platform from the substrate; and
   a rotor comb actuator, for interleaving with the stator comb actuator, extending from the mirrored platform for rotating the mirrored platform about the second axis.

2. The device according to claim 1, wherein the mirrored platform comprises an internal frame structure pivotable about the second axis via the second hinge, and an external deck pivotable with the internal platform about the second axis and pivotable relative to the internal platform about the first axis via the first hinge.

3. The device according to claim 2, further comprising a mirror anchor post extending upwardly from the substrate at an intersection of the first and second axes, whereby the mirrored platform is pivotally mounted on the mirror anchor post.

4. The device according to claim 3, wherein the second hinge includes first and second torsional beams extending from the internal frame structure to the anchor post, which extends upwardly from the substrate through an opening in the internal frame structure.

5. The device according to claim 4, wherein the mirrored platform is wider than the second hinge, whereby a plurality of mirrored platforms can be closely packed together.

6. The device according to claim 4, wherein the first hinge includes third and fourth torsional beams extending from opposite ends of the internal frame structure to opposite sides of the external deck, respectively, whereby the external deck rotates relative to the internal frame structure about the first axis when the first and second electro-static plate electrodes are actuated.

7. The device according to claim 2, wherein the rotor comb actuator includes first and second sets of rotor comb fingers extending from opposite ends of the internal frame structure.

8. The device according to claim 2, wherein the first hinge includes third and fourth torsional beams extending from opposite ends of the internal frame structure, whereby the external deck rotates relative to the internal frame structure about the first axis when the first and second electro-static plate electrodes are actuated.

9. The device according to claim 2, wherein the rotor comb actuator comprises first and second rotor comb actuators; wherein the internal frame structure includes first and second cantilevered beams from which the first and second rotor comb actuators extends; and wherein each of the first and second cantilevered beams includes a stressed layer for bending the first and second cantilevered beams and the first and second rotor comb actuators extending therefrom at an acute angle to the substrate.

10. The device according to claim 9, wherein the internal frame structure includes first and second skeletal frames extending from the first and second cantilevered beams, respectively, around the first and second comb actuators, respectively; and wherein the first hinge includes a first torsional beam extending from the first skeletal frame to the external deck, and a second torsional beam extending from the second frame to the external deck, whereby bending of the cantilevered beams causes the first and second skeletal frames to bend accordingly, thereby lifting the external deck relative to the internal frame structure.

11. The device according to claim 9, wherein the internal frame structure includes first and second skeletal frames extending therefrom, around the first and second comb actuators, respectively; and wherein the first hinge includes a first torsional beam extending from the first frame to the external deck, and a second torsional beam extending from the second frame to the external deck, whereby bending of the cantilevered beams causes the first and second comb actuators to bend accordingly, thereby lifting the first and second comb actuators at an acute angle relative to the internal frame structure.

12. The device according to claim 2, wherein the stator comb actuator extends parallel to the substrate in a first plane; and wherein the rotor comb actuator extends parallel to the substrate in a second plane, which is parallel to the first plane, in a rest position, and at an acute angle to the stator comb actuator, in an actuated position.

13. The device according to claim 1, wherein the external deck includes a wing section disposed above the first electrostatic plate electrode, and a reflective section extending along x axis.

14. The device according to claim 1, further comprising a mirror anchor post extending upwardly from the substrate at an intersection of the first and second axes, whereby the mirrored platform is pivotally mounted on the mirror anchor post.

15. The device according to claim 1, wherein the first hinge comprises first and second serpentine torsional bars having one end on one side of the first axis and one end on an opposite side of the first axis.

16. The device according to claim 1, wherein the second hinge comprises first and second serpentine torsional bars having one end on one side of the second axis and one end on an opposite side of the second axis.

17. A method of making the micro-mirror device of claim 9, comprising the steps of:
 a) providing a double silicon on insulator structure including first and second structural layers, and first and second insulator layers;
 b) etching the first and second insulator layers, and the second structural layer to form the first and second cantilevered beams on the first structural layer;
 c) mounting the first structural layer on the substrate;
 d) etching the first structural layer to form the first and second hinges, the rotor comb actuator, and the stator comb actuator; and
 e) etching the first structural layer above the first and second cantilevered beams, thereby releasing the first and second cantilevered beams enabling them to bend at an acute angle.

18. A method of making the micro-mirror device of claim 9, comprising the steps of:
 a) providing a silicon on insulator structure including a structural layer, and a first and second insulator layers;
 b) etching the first insulator layer to define the first and second cantilevered beams on the first structural layer;
 c) mounting the first structural layer on the substrate;
 d) etching the first structural layer to form the first and second hinges, the rotor comb actuator, and the stator comb actuator; and
 e) etching the first structural layer above the first and second cantilevered beams, thereby releasing the first and second cantilevered beams enabling them to bend at an acute angle.

* * * * *